(12) United States Patent
Deniz

(10) Patent No.: US 9,076,787 B2
(45) Date of Patent: Jul. 7, 2015

(54) FABRICATION OF NICKEL FREE SILICIDE FOR SEMICONDUCTOR CONTACT METALLIZATION

(71) Applicant: GLOBALFOUNDRIES Inc., Grand Cayman (KY)

(72) Inventor: Derya Deniz, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/536,737

(22) Filed: Nov. 10, 2014

(65) Prior Publication Data

US 2015/0061032 A1    Mar. 5, 2015

Related U.S. Application Data

(62) Division of application No. 13/910,370, filed on Jun. 5, 2013, now Pat. No. 8,912,057.

(51) Int. Cl.
*H01L 29/51* (2006.01)
*H01L 21/283* (2006.01)
*H01L 29/45* (2006.01)
*H01L 29/78* (2006.01)

(52) U.S. Cl.
CPC ............ *H01L 29/517* (2013.01); *H01L 21/283* (2013.01); *H01L 29/45* (2013.01); *H01L 29/78* (2013.01)

(58) Field of Classification Search
CPC .............. H01L 21/823842; H01L 21/823857; H01L 29/66545; H01L 27/0922; H01L 21/76224; H01L 29/78; H01L 21/82345; H01L 2924/13085; H01L 2924/13092; H01L 29/665; H01L 29/7831; H01L 21/28052; H01L 21/28097; H01L 21/28518; H01L 21/7624; H01L 21/76837; H01L 29/4975
See application file for complete search history.

(56) References Cited

U.S. PATENT DOCUMENTS

| | | | |
|---|---|---|---|
| 4,898,804 A | 2/1990 | Rauschenbach et al. | |
| 6,307,214 B1 | 10/2001 | Ohtani et al. | |
| 6,617,648 B1 * | 9/2003 | Yamazaki et al. | 257/350 |
| 6,624,051 B1 | 9/2003 | Ohtani et al. | |
| 6,798,022 B1 | 9/2004 | Kuroda et al. | |
| 7,316,960 B2 | 1/2008 | Ting | |
| 7,462,538 B2 * | 12/2008 | Li et al. | 438/264 |

(Continued)

OTHER PUBLICATIONS

Deniz et al., "Fabrication of Nickel Free Silicide for Semiconductor Contact Metallization", U.S. Appl. No. 13/910,370, filed Jun. 5, 2013, 23 pages.

*Primary Examiner* — Evan Pert
*Assistant Examiner* — Gustavo Ramallo
(74) *Attorney, Agent, or Firm* — Heslin Rothenberg Farley & Mesiti P.C.; Nicholas Mesiti, Esq.

(57) ABSTRACT

A semiconductor device with an n-type transistor and a p-type transistor having an active region is provided. The active region further includes two adjacent gate structures. A portion of a dielectric layer between the two adjacent gate structures is selectively removed to form a contact opening having a bottom and sidewalls over the active region. A bilayer liner is selectively provided within the contact opening in the n-type transistor and a monolayer liner is provided within the contact opening in the p-type transistor. The contact opening in the n-type transistor and p-type transistor is filled with contact material. The monolayer liner is treated to form a silicide lacking nickel in the p-type transistor.

9 Claims, 5 Drawing Sheets

(56) References Cited

U.S. PATENT DOCUMENTS

| | | |
|---|---|---|
| 7,525,136 B2 * | 4/2009 | Saha et al. .................... 257/270 |
| 7,638,370 B2 | 12/2009 | Gossner et al. |
| 7,755,144 B2 | 7/2010 | Li et al. |
| 7,892,900 B2 * | 2/2011 | Liu et al. ...................... 438/154 |
| 8,030,709 B2 * | 10/2011 | Adams et al. ................. 257/369 |
| 8,946,075 B2 * | 2/2015 | Cai et al. ...................... 438/621 |
| 2005/0064690 A1 * | 3/2005 | Amos et al. ................... 438/592 |
| 2008/0093682 A1 | 4/2008 | Yao et al. |
| 2010/0129968 A1 | 5/2010 | Li et al. |
| 2014/0124841 A1 * | 5/2014 | Xie et al. ...................... 257/288 |
| 2014/0197468 A1 * | 7/2014 | Xie et al. ...................... 257/288 |

* cited by examiner

FABRICATION OF NICKEL FREE SILICIDE FOR SEMICONDUCTOR CONTACT METALLIZATION

CROSS REFERENCE TO RELATED APPLICATIONS

This application is a divisional application of U.S. patent application Ser. No. 13/910,370, filed Jun. 5, 2013, and entitled "FABRICATION OF NICKEL FREE SILICIDE FOR SEMICONDUCTOR CONTACT METALLIZATION," the entirety of which is hereby incorporated herein by reference.

BACKGROUND OF THE INVENTION

1. Technical Field

The present invention generally relates to semiconductor devices and methods of fabricating the semiconductor devices. More particularly, the present invention relates to semiconductor devices and methods of fabricating nickel-free silicide for contact metallization.

2. Background Information

Silicide processes have been widely used to form silicide contacts on the gate and source/drain during the semiconductor device fabrication processing to improve the performance of the semiconductor device. The silicide layer improves the operational speed of the semiconductor device by reducing the contact resistance between the metal contact and source and drain.

More recently, nickel monosilicide (NiSi) has been employed as the silicide material of choice, because of the several advantages associated with it, such as, for example, low resistance (10.5-18 $\mu\Omega$cm) and low formation temperature (350° C.). However, nickel silicide is sensitive to oxygen contamination from the ambient air and from residual interfacial contaminants such as native oxides. Such contamination can lead to rough and/or insulating interfaces causing high contact resistance in the device. The diffusion characteristics of nickel into underlying silicon (Si), silicon germanium (SiGe) and germanium (Ge) substrates can create issues such as, piping/spiking defects during the silicidation process, which leads to leakage of current into the channel as well as the junction regions, resulting in degradation in device performance.

Hence, there exists a need to develop silicidation processes lacking nickel for improving the semiconductor device performance in scaled-down technologies.

SUMMARY OF THE INVENTION

The shortcomings of the prior art are overcome and additional advantages are provided through the provision, in one aspect, of a method of forming a bilayer liner in a semiconductor device. The method includes providing a semiconductor device with an n-type transistor and a p-type transistor and the n-type transistor and the p-type transistor include an active region, the active region including two adjacent gate structures thereon. The method further includes selectively removing a portion of a dielectric layer between two adjacent gate structures to form a contact opening, wherein the contact opening is defined by a bottom and sidewalls, and the contact opening further residing over the active region in each of the n-type transistor and the p-type transistor. The method further includes selectively providing a bilayer liner within the contact opening residing over the active region in the n-type transistor and providing a monolayer liner within the contact opening residing over the active region in the p-type transistor and filling the contact opening with contact material. The resultant contacts in the semiconductor device are metalized nickel free.

In accordance with another aspect, a semiconductor device is provided, including an intermediate structure of the semiconductor device having an n-type transistor and a p-type transistor, an active region of the semiconductor device and two adjacent gate structures over the active region of the semiconductor device in each of the n-type transistor and the p-type transistor. The semiconductor device further includes a contact opening in a dielectric layer between the two adjacent gate structures, the contact opening residing over the active region in each of the n-type transistor and the p-type transistor. Furthermore, a bilayer liner within the contact opening resides over the active region in the n-type transistor and a monolayer liner within the contact opening resides over the active region of the p-type transistor.

These and other objects, features and advantages of this invention will become apparent from the following detailed description of the various aspects of the invention taken in conjunction with the accompanying drawings.

DETAILED DESCRIPTION OF THE INVENTION

Figure 1:
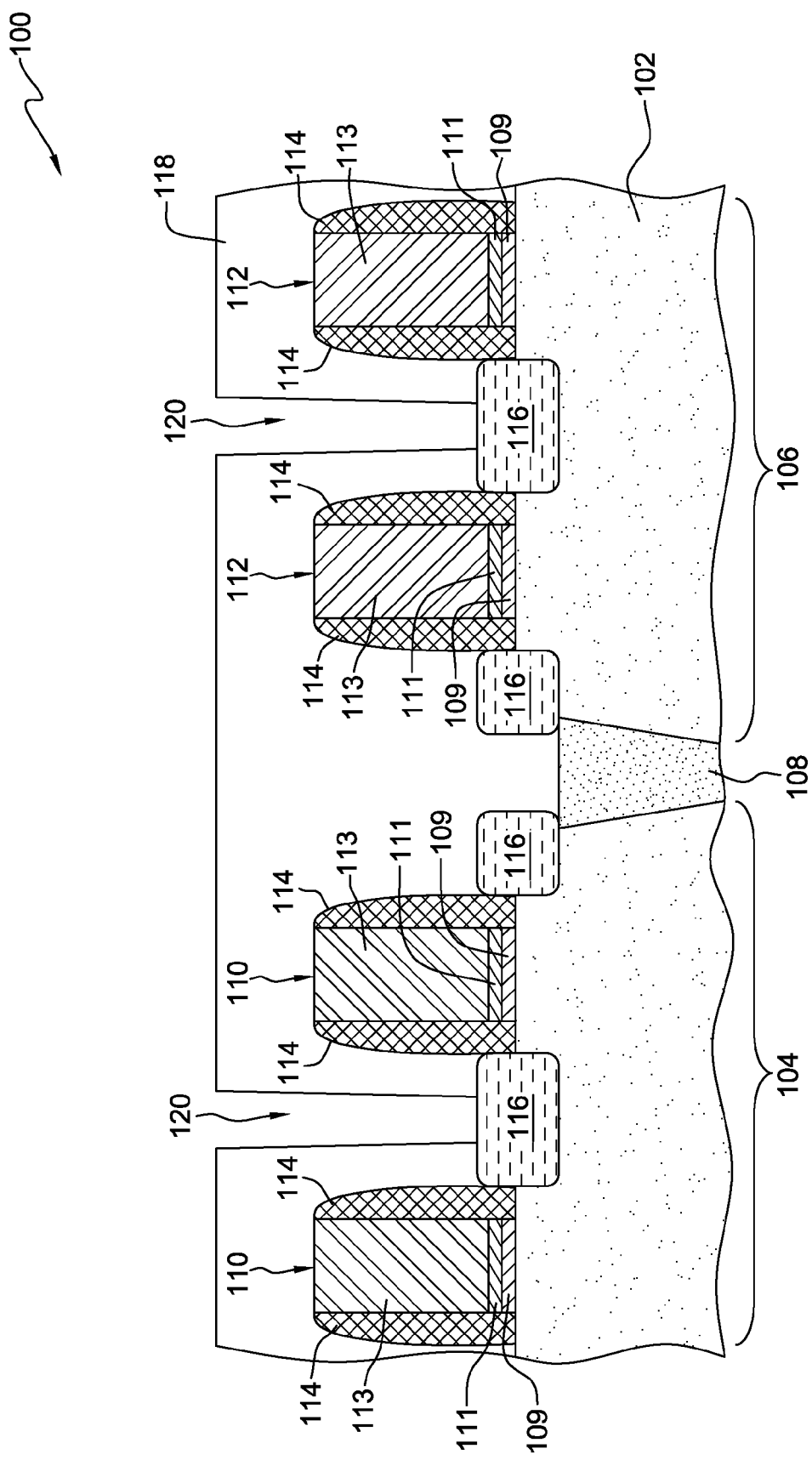
FIG. 1 is a cross-sectional view of one embodiment of an intermediate structure obtained during a semiconductor device fabrication process, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified.

In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one embodiment of an intermediate structure, generally denoted 100, obtained during fabrication of a semiconductor device, in accordance with one or more aspects of the present invention. At the point of fabrication depicted in FIG. 1, intermediate structure 100 includes a substrate 102, such as a bulk semiconductor material, for example, bulk silicon wafer. In one example, substrate 102 may include any silicon-containing substrate including, but not limited to, silicon (Si), single crystal silicon, polycrystalline Si, amorphous Si, silicon-on-nothing (SON), silicon-on-insulator (SOI), or silicon-on-replacement insulator (SRI) substrates and the like. Substrate 102 may in addition or instead include various isolations, dopings and/or device features. The substrate may include other suitable elementary semiconductors, such as, for example, germanium (Ge) in crystal, a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

Continuing with FIG. 1, intermediate structure 100 includes a plurality of transistors, for instance, P-type field-effect transistor (PFET) 104 (referred to hereafter, as p-type transistor) and N-type field-effect transistor (NFET) 106 (referred to, hereafter, as n-type transistor) formed over substrate 102. The p-type transistor 104 and n-type transistor 106 are laterally separated by isolation features 108, such as, for example, shallow trench isolation features (STI). The formation of isolation regions, such as shallow trench isolation may include, for instance, forming a recess within the substrate and filling the trench with a dielectric material, such as, for example, high-density plasma (HDP) oxide or TEOS (tetraethylorthosilicate) base silicon oxide, silicon nitride and the like. Although not critical to the invention, p-type transistor 104 and n-type transistor 106 further include, corresponding adjacent gate structures 110, 112 respectively, with sidewall spacers 114 disposed on the sides of respective adjacent gate structures 110, 112. As one example, each adjacent gate structures 110, 112 may include one or more conformally-deposited layers, such as gate dielectric layer 109 and/or one or more work function layers 111 disposed over gate dielectric layer 109. Note that these layers may be formed using a variety of different materials and techniques, such as, for example, atomic layer deposition (ALD), metal organic chemical vapor deposition (MOCVD) and chemical vapor deposition (CVD). The thickness of the layers may also vary, depending upon the particular application.

As one example, gate dielectric layer 109 may be formed of a material such as silicon dioxide or a high-k dielectric material with a dielectric constant k greater than about 3.9 (note that k=3.9 for $SiO_2$), and may be deposited by performing a suitable deposition process, such as atomic layer deposition (ALD), chemical vapor deposition (CVD), physical vapor deposition (PVD), or the like. Examples of high-k dielectric materials which may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate. As noted, one or more work-function layers 111 may be conformally deposited over gate dielectric layer 109, for example, via a deposition process such as ALD, MOCVD, CVD or PVD. The work-function layer(s) may include, for instance, one or more P-type metals or one or more N-type metals, depending on whether the gate structure is part of, for instance, a p-type transistor or an n-type transistor. Work-function layer(s) 111 may include an appropriate refractory metal nitride, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN). In another specific example, work-function layer(s) 111 may include an appropriate refractory metal carbide, for example, titanium carbide (TiC), titanium aluminum carbide (TiAlC), tantalum carbide (TaC), tantalum alimun carbide (TaAlC), niobium carbide (NbC), vanadium carbide (VC) etc.

Gate structures 110, 112 may also include any of a variety of metal gate electrodes 113 such as, for example, tungsten (W), aluminum (Al) and may be conformally deposited over the one or more conformally deposited work function layers. Sidewall spacers 114 are disposed on the sides of respective adjacent gate structures 110 and 112 and may include, for example, silicon nitride. Sidewall spacers 114 may be deposited using conventional deposition processes, such as, for example, CVD or plasma assisted CVD.

Continuing with FIG. 1, an active region 116 is disposed over substrate 102. As one example, active region 116 may include a semiconductor material with or to include respective source and drain regions of multiple transistors and may be formed using an ion implantation process. In one embodiment, active region 116 may include extension source and drain regions, deep source and drain regions (not shown), and halo regions (not shown). In a specific example, P-type source regions for p-type transistor 104 are typically formed by doping with group III-A elements such as, for example, boron and N-type source regions for n-type transistor 106 are typically formed by doping with group V-A elements such as, for example, arsenic or phosphorus. In another embodiment, active region 116 may include epi regions grown on fins as well. In one example, the epi regions grown on fins between the gates may be fully merged, partially merged or unmerged epi regions. In another example, the epi region may include an additional capping layer, more particularly, in the case of p-type transistor.

Referring still to FIG. 1, a dielectric layer 118 is shown disposed over entire substrate 102 including adjacent gate structures 110, 112 of corresponding p-type transistor 104 and n-type transistor 106. In one example, dielectric layer 118 may include, but not limited to, any silicon-containing materials such as $SiO_2$, $Si_3N_4$, $SiO_xN_y$, SiC, SiCO, SiCOH and SiCH compounds. The dielectric layer may be formed using deposition processes, including, but not limited to, chemical vapor deposition (CVD) and plasma enhanced CVD (PECVD).

Continuing further with FIG. 1, dielectric layer 118 may be patterned with one or more contact openings 120 between adjacent gate structures 110, 112 of corresponding p-type transistor 104 and n-type transistor 106, to facilitate defining the contact structures disclosed herein. The patterning of dielectric layer 118 may extend to active regions 116 of corresponding p-type transistor 104 and n-type transistor 106 such that the one or more contact openings 120 reside over the active regions 116 of corresponding p-type transistor 104 and n-type transistor 106. Although described with respect to a contact opening in this example, it will be understood that the method of invention is applicable to other features in a semiconductor device, effectively having sidewalls and a bottom, so as to facilitate formation of the contact structures or contact metallization to electrically connect to (for example) the active regions of the transistor. The contact openings 120 may be formed using any suitable etching process, such as anisotropic dry etching, for instance, reactive ion etching.

As will be subsequently explained, the present invention seeks to improve semiconductor device performance by eliminating the use of nickel during silicidation process, prior to the contact metallization. This may be accomplished by selectively providing a bilayer liner within the contact opening residing over the active region in the n-type transistor and providing a monolayer liner within the contact opening residing over the active region in the p-type transistor and filling the contact opening with contact material. The present invention may further be accomplished by selectively providing a protective mask over the contact opening residing over the active region in the p-type transistor. A first liner material is provided over the protective mask, the first liner material extending laterally over upper surface of the dielectric layer and further extending over the bottom and the sidewalls of the contact opening residing over the active region in the n-type transistor. The first liner is selectively removed over the protective mask and the upper surface of the dielectric layer, and leaving over the bottom and the sidewalls of the contact opening residing over the active region in the n-type transistor. The protective mask over the contact opening residing over the active region in the p-type transistor is selectively removed. A second liner material is provided over the contact opening residing over the active region in the p-type transistor and extending laterally over the upper surface of the dielectric layer and further extending over the first liner material residing in the bottom and the sidewalls of the contact opening residing over the active region in the n-type transistor.

In one aspect, the first liner material may include a first material and the second liner material may include a second material, and the first material being different from the second material. In one example, the first material may include one of metal-oxide-insulator semiconductor material, with the metal-oxide-insulator semiconductor material being compatible with n-type transistor. In another example, the second material may include one of a silicide precursor lacking nickel.

In a further aspect, the second liner material over the contact opening residing over the active region in each of the p-type transistor and n-type transistor is annealed to create a silicide in the bottom of the contact opening residing over the active region in the p-type transistor.

Figure 2:
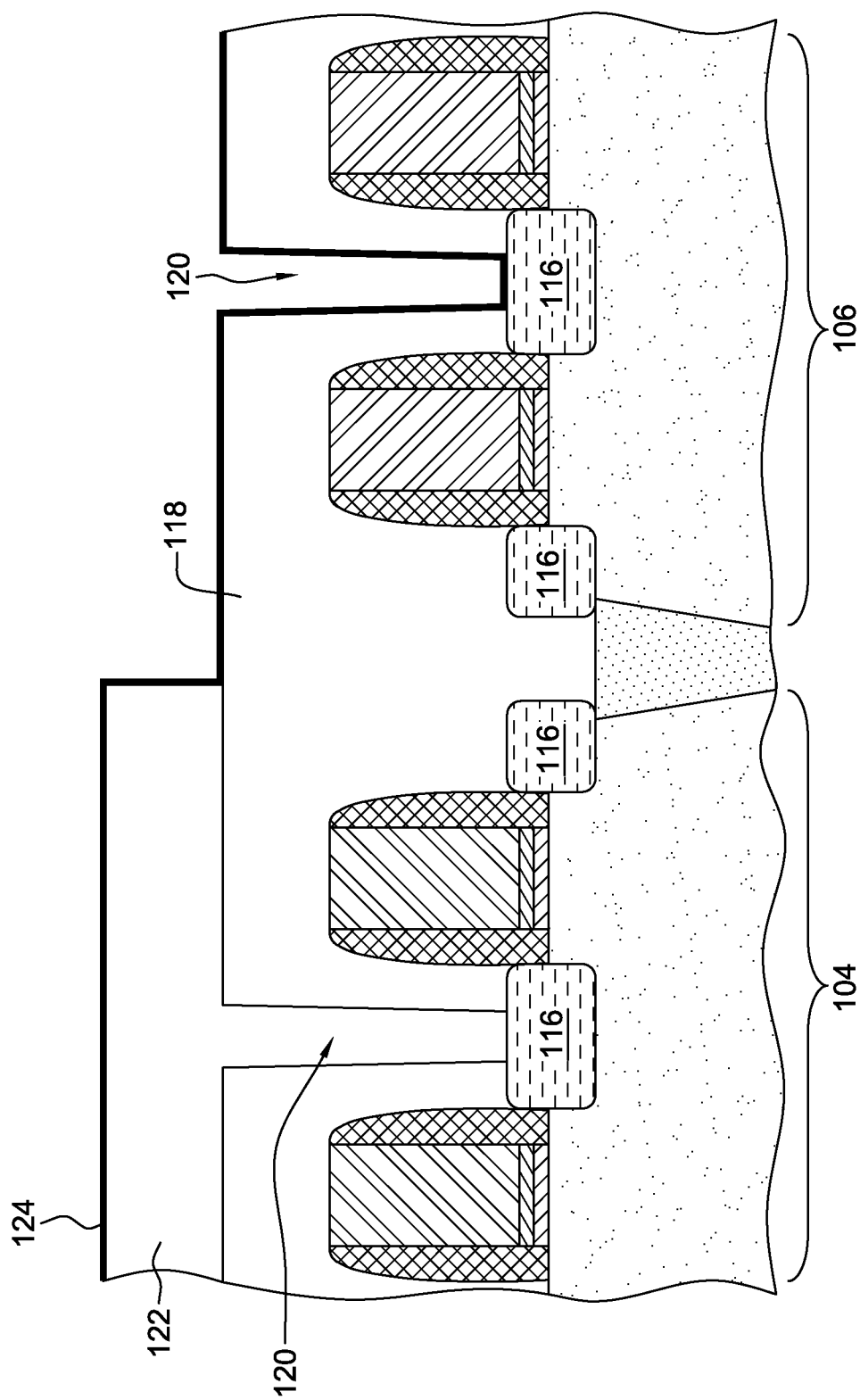
FIG. 2 depicts the intermediate structure of FIG. 1 after a first liner material having selectively been provided over n-type transistor, in accordance with one or more aspects of the present invention.

Accordingly, referring to FIG. 2, a protective mask 122 is provided selectively over dielectric layer 118 in the p-type transistor 104, using conventional deposition techniques, as is known by those skilled in the art. Note that protective mask 122 is conformally filled within contact opening 120 residing over active region 116 of p-type transistor 104, and extends above adjacent gate structures 110 of the p-type transistor, thereby protecting gate structures 110 of the p-type transistor during subsequent fabrication processing. In one example, the protective mask may be an optical dispersion layer (ODL) or an optical planarization layer (OPL). In another specific example the protective mask may be tungsten (W) or cobalt (Co). The thickness of protective mask 122 above p-type transistor 104 may be, for example, such as to allow subsequent ODL deposition and planarization.

Continuing further with FIG. 2, a first liner material 124 is conformally deposited over the structure and disposed over protective mask 122 protecting p-type transistor 104. Note that first liner material 124 extends laterally over upper surface of dielectric layer 118 and further extends over the bottom and the sidewalls of contact opening 120 residing over active region 116 in n-type transistor 106. The presence of the first liner material advantageously facilitates reducing the Schottky barrier of the n-type transistor and increasing the conduction of electrons from the subsequently deposited contact metal to the active region in the n-type transistor, which in turn, facilitates improving performance of the resultant transistor. First liner material 124 may include an appropriate metal-oxide-insulator semiconductor material, such as, for example, zinc oxide (ZnO), aluminum oxide ($Al_2O_3$), titanium oxide ($TiO_2$), zirconium oxide (ZrO) and the like. By way of example, the first liner material, being compatible with n-type transistor, may be deposited to a thickness in the range of about 0.5 nanometer to about 10 nanometers, and more preferably, in the range of about 0.5 nanometer to about 3 nanometers. In one example, first liner material 124 may be deposited using conventional process(es) such as, for example, atomic layer deposition (ALD), metal organic chemical vapor deposition (MOCVD), chemical vapor deposition (CVD) and/or various physical vapor deposition (PVD) techniques such as, for example, radio-frequency PVD (RF-PVD).

Figure 3:
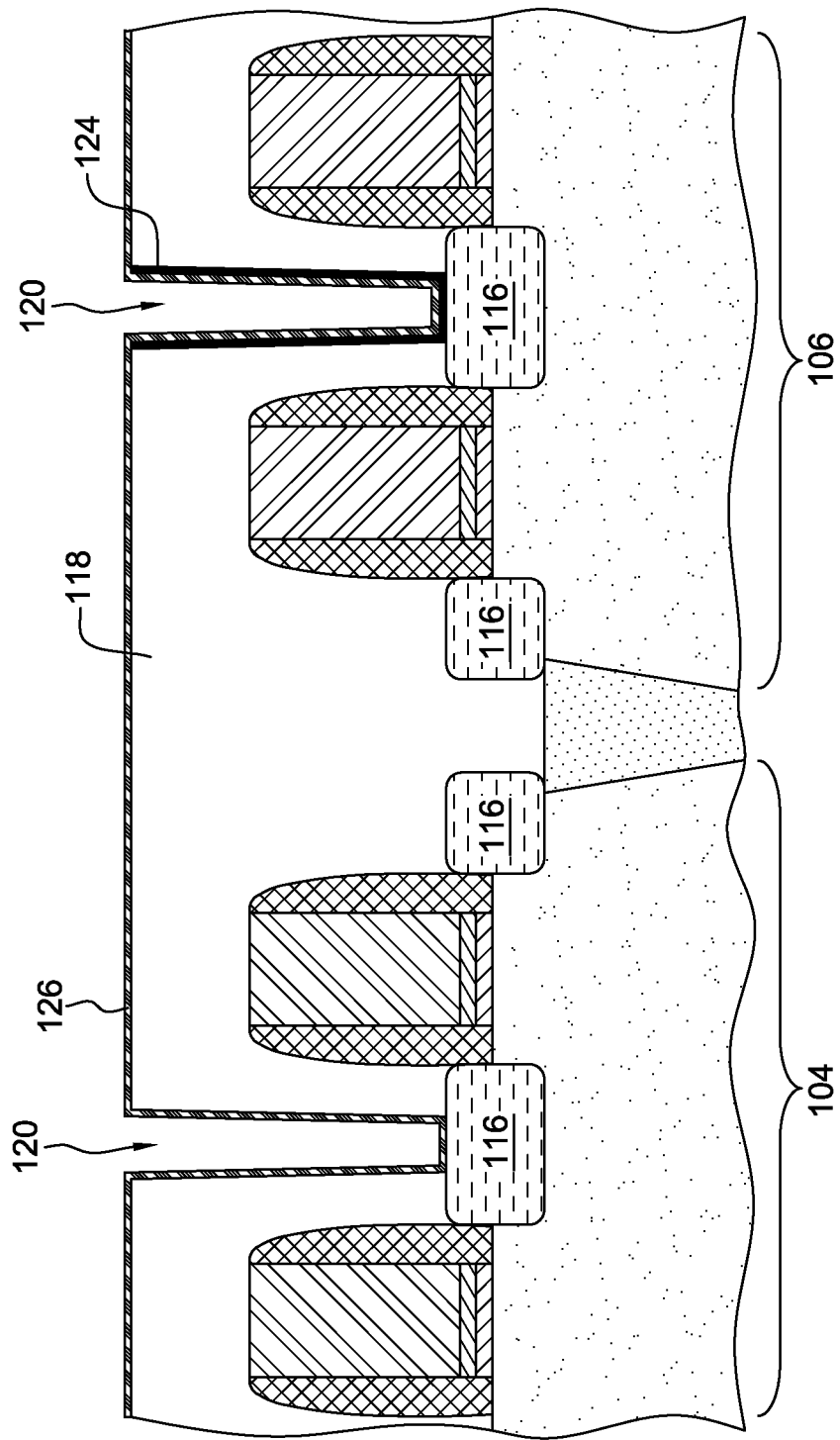
FIG. 3 depicts the intermediate structure of FIG. 2 after a second liner material having been provided over p-type transistor and over the first liner material over the n-type transistor, in accordance with one or more aspects of the present invention.

As illustrated in FIG. 3, excess first liner material 124 may be selectively removed using protective layer 122 (see FIG. 2) and dielectric layer 118 over n-type transistor 106, as an etch stop. The removal of excess first liner material 124 may be performed using conventional techniques well known in the art, such as, for example, chemical mechanical polishing (CMP) or conventional etch back processes, with for instance, the chemical-mechanical polishing terminating at protective layer 122 (see FIG. 2) and dielectric layer 118, resulting in first liner material 124 disposed over the bottom and the sidewalls of contact opening 120 residing over active region 116 in the n-type transistor 106.

Continuing further with FIG. 3, a protective layer (not shown) is selectively provided over the contact opening 120 residing over active region 116 in the n-type transistor and a non-selective chemical-mechanical polish may be employed to polish away protective layer 124 (see FIG. 2), with the chemical-mechanical polishing terminating at, for instance, dielectric layer 118. The protective layer (not shown) provided over the contact opening 120 residing over active region 116 in the n-type transistor is removed using a conventional wet etch process. Note that first liner material 124 disposed over the bottom and sidewalls of contact opening 120 residing over active region 116 in the n-type transistor 106 is undisturbed during the removal of protective mask 124. Subsequently, a second liner material 126 is conformally deposited over the structure and provided over contact opening 120 residing over active region 116 in p-type transistor 104. Note that second liner material extends laterally over the upper surface of dielectric layer 118 and further extends over first liner material 124 residing in the bottom and the sidewalls of contact opening 120 residing over active region 116 in the n-type transistor 106. The second liner material 126 may be fabricated of or include a material that advantageously facilitates forming a silicide within the contact opening in the p-type transistor, during subsequent fabrication processing as well as improving the adhesion of the contact metal, during the subsequent contact metallization, to form the contact structures in the p-type transistor and n-type transistor. In one example, second liner material 126 may be deposited by using conventional deposition processes, such as, for example, physical vapor deposition (PVD), chemical vapor deposition (CVD), pulsed CVD, plasma-enhanced CVD (PECVD), metal organic CVD (MOCVD), atomic layer deposition (ALD), plasma-enhanced ALD (PEALD) or sputtering methods. The thickness of the second liner material may be about 1 nanometer to about 10 nanometers. In one example, second liner material 126 may be a silicide precursor lacking nickel which may include elemental metals such as, for example, titanium (Ti), cobalt (Co), tungsten (W), platinum (Pt), palladium (Pd) and the like.

Figure 4:
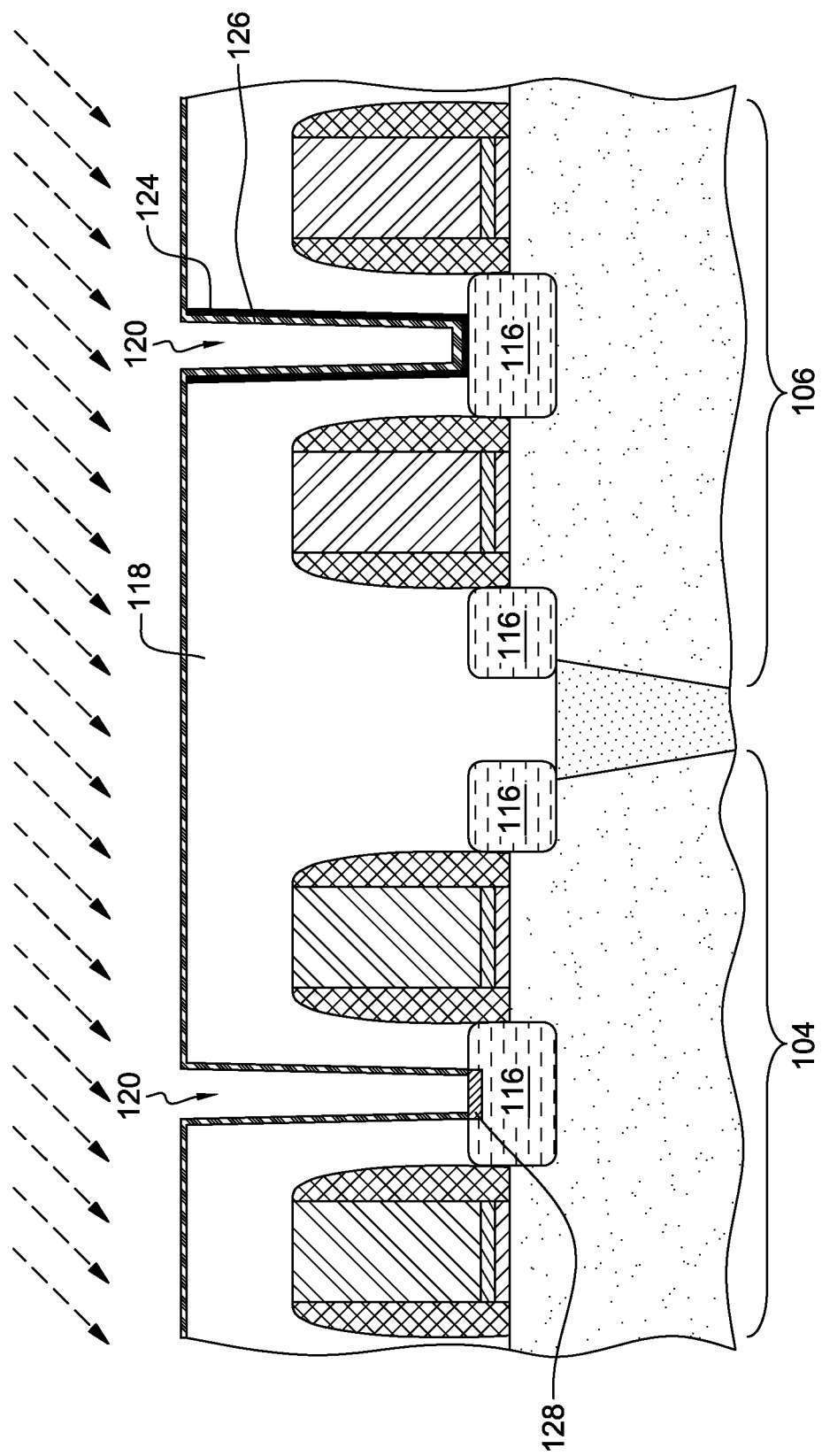
FIG. 4 depicts the intermediate structure of FIG. 3 after annealing, in accordance with one or more aspects of the present invention.

FIG. 4 depicts the intermediate structure of FIG. 3 after subjecting second liner material 126 (see FIG. 3), disposed over contact openings 120 in p-type transistor 104 and n-type transistor 106, to an annealing process performed under a variety of time and/or temperature combinations. This annealing process advantageously facilitates creating a silicide 128 within contact opening 120 residing over active region 116 in p-type transistor 104. In addition, the annealing process also facilitates creating oxygen vacancies over second liner material 126, in n-type transistor 106, within contact opening 118 by gathering the oxygen present in first liner material 124, which in turn, further improves the performance of the resultant semiconductor device. In a specific example, the annealing process facilitates creating a silicide 128 such as, for example, titanium silicide in p-type transistor 104 while creating oxygen vacancies in n-type transistor 106, by gathering the oxygen, for instance, present in the underlying zinc oxide. The annealing process may be performed using one of a variety of conventional annealing techniques such as, for example, laser annealing, flash anneal, microwave anneal, soak anneal or spike anneal (SOG anneal). In one example, laser annealing may be performed at about 700° C. to about 1100° C. for about 0.1 milliseconds to about 50 milliseconds. In another specific example, spike annealing may be performed for about 400° C. to about 1100° C. for about 1 second to about 30 seconds. In another specific example, soak annealing may be performed for about 300° C. to 1100° C. for about 1 second to about 24 hours.

Figure 5:
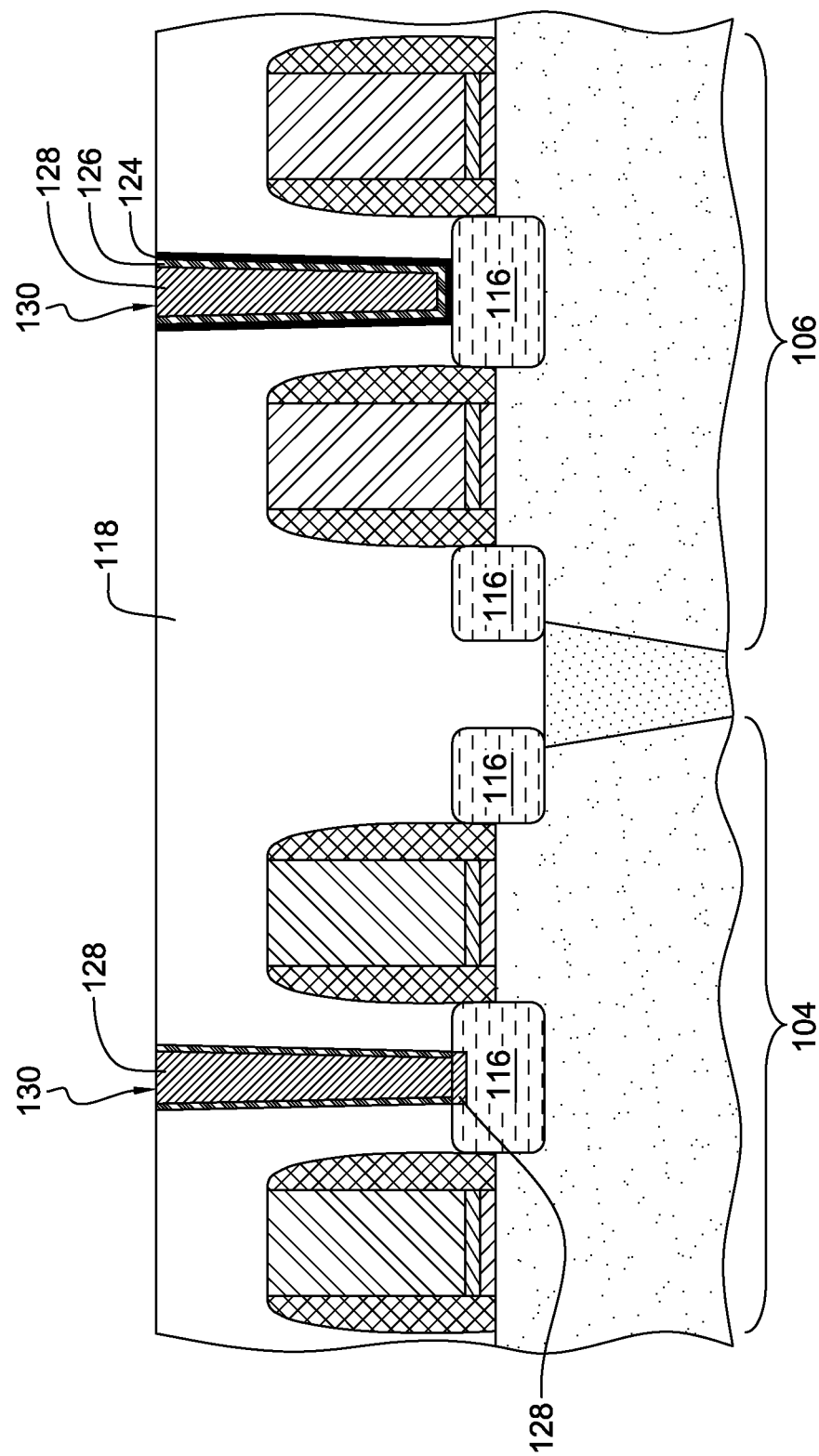
FIG. 5 depicts the resultant semiconductor device of FIG. 4 after contact material having been provided, in accordance with one or more aspects of the present invention.

As illustrated in FIG. 5, a conductive contact material 128 is provided within the contact openings 120 (see FIG. 1), resulting in contact structures 130 to electrically connect to (for example) the active regions of the transistor. In one example of the process, a tungsten nucleation layer (not shown) may be deposited over the second liner material 126 to facilitate the subsequent formation of the bulk tungsten material, using conventional deposition processes such as metal organic chemical vapor deposition (MOCVD), chemical vapor deposition (CVD), atomic layer deposition (ALD) and pulsed nucleation layer deposition (PNL) deposition processes. The thickness of the nucleation layer may be about 1 nm to about 5 nm and may be deposited by performing alternating pulsing sequences of boron-containing reducing agent and tungsten-containing precursor in presence of a reducing agent. In another example of the process, a cobalt nucleation layer may be deposited over the second liner material 126 to accommodate the bulk cobalt formation. The formed tungsten layer may be used as a nucleation layer followed by bulk deposition of tungsten using conventional chemical vapor deposition (CVD) processes, as is known by those skilled in the art. Note that, in another embodiment, annealing process performed, as described in connection with FIG. 4, to facilitate the formation of silicide 128 (see FIG. 4) within contact opening 120 residing over active region 116 in p-type transistor 104, may alternatively be performed after the bulk deposition of tungsten.

Continuing further with FIG. 5, a non-selective chemical-mechanical polish may be employed to polish away excess conductive contact material 128 and excess second liner 126, with the chemical-mechanical polishing terminating at, for instance, dielectric layer 118, resulting in the height of the contact structures being substantially equal to the height of dielectric layer 118 as illustrated. Advantageously, the semiconductor device results in nickel-free silicide for contact metallization. Further, the present invention may be more cost effective than the current conventional processes and may also be applicable to advanced multigate devices, such as trigate or FinFET having, for instance, merged or unmerged epitaxial growth.

While several aspects of the present invention have been described and depicted herein, alternative aspects may be affected by those skilled in the art to accomplish the same objectives. Accordingly, it is intended by the appended claims to cover all such alternative aspects as fall within the true spirit and scope of the invention.

The invention claimed is:
1. A semiconductor device, comprising:
an intermediate structure of the semiconductor device, comprising an n-type transistor and p-type transistor;
an active region of the semiconductor device and two adjacent gate structures residing over the active region of the semiconductor device in each of the n-type transistor and the p-type transistor;
a contact opening in a dielectric layer between the two adjacent gate structures, the contact opening residing over the active region in each of the n-type transistor and the p-type transistor;
a bilayer liner within the contact opening residing over the active region in the n-type transistor and a monolayer liner within the contact opening residing over the active region in the p-type transistor.

2. The semiconductor device of claim 1, wherein the bilayer liner comprises a first liner material within the contact opening residing over the active region in the n-type transistor.

3. The semiconductor device of claim 1, wherein the bilayer liner comprises a second liner material over the first liner material within the contact opening residing over the active region in the n-type transistor.

4. The semiconductor device of claim 3, wherein first liner material comprises a first material and the second liner material comprises a second material, and wherein the first material being different from the second material.

5. The semiconductor device of claim 4, wherein the first material comprises one of metal-oxide-insulator semiconductor material, and wherein the metal-oxide-insulator material being compatible with n-type transistor, the metal-oxide insulator material lacking nickel.

6. The semiconductor device of claim 4, wherein the second material comprises one of a silicide precursor lacking nickel.

7. The semiconductor device of claim 3, wherein the monolayer liner material comprises the second liner material within the contact opening residing over the active region in the p-type transistor.

8. The semiconductor device of claim 7, wherein the monolayer liner is treated to form a silicide.

9. The semiconductor device of claim 3 wherein the first liner material and second liner material are made of the same material.

* * * * *